United States Patent
Dhong et al.

(10) Patent No.: US 7,245,159 B2
(45) Date of Patent: Jul. 17, 2007

(54) PROTECTING ONE-HOT LOGIC AGAINST SHORT-CIRCUITS DURING POWER-ON

(75) Inventors: Sang Hoo Dhong, Austin, TX (US); Christian Jacobi, Boblingen (DE); Hwa-Joon Oh, Austin, TX (US); Silvia Melitta Mueller, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 10/891,771

(22) Filed: Jul. 15, 2004

(65) Prior Publication Data

US 2006/0012399 A1 Jan. 19, 2006

(51) Int. Cl.
*H03K 19/20* (2006.01)
(52) U.S. Cl. .............................. 326/113; 326/9; 326/15
(58) Field of Classification Search ................ 326/113, 326/9, 12–13, 15; 327/407–408
See application file for complete search history.

(56) References Cited

U.S. PATENT DOCUMENTS

| 6,452,423 B1 * | 9/2002 | Das et al. .................... 326/113 |
| 6,559,677 B2 * | 5/2003 | Nitawaki ..................... 326/83 |

* cited by examiner

*Primary Examiner*—Anh Q. Tran
(74) *Attorney, Agent, or Firm*—Carr LLP; D'ann N. Rifai

(57) ABSTRACT

A method, a computer program, and an apparatus are provided to protect transmission gates in a multiplexer (mux). Because transmission gates are much faster than the more convention AND-OR arrays, transmission gate usage in muxes are being used more often in high speed circuitry. However, transmission gate have a significant problem in that short circuit are possible for situations where there is not a one-hot select signal. Therefore, to eliminate the problem, logic gates are utilized specifically during Power-On Reset (POR) to force a one-hot selection to prevent any possible short circuits.

21 Claims, 4 Drawing Sheets

PROTECTING ONE-HOT LOGIC AGAINST SHORT-CIRCUITS DURING POWER-ON

FIELD OF THE INVENTION

The present invention relates generally to protection circuitry for logic, and more particularly, to protection circuitry for transmission logic, such as transmission gates, multiplexers (muxes) and other topologies.

DESCRIPTION OF THE RELATED ART

In a variety of high performance microprocessors, transmission gates are increasingly utilized over the more conventional structures in muxes, such as AND-OR structures. Typically, these muxes utilize multiple ports where the select signals are computed from select logic.

Referring to FIG. 1, the reference numeral 100 generally designates a conventional transmission gate. The transmission gate 100 comprises a Positive-type Metal Oxide Semiconductor Field Effect Transistor (PMOS) 102, a Negative-type MOSFET (NMOS) 104, and an inverter 106. The source of the PMOS 102 is coupled to the source of the NMOS 104 at first node 108. Data is also input into the first node 108. A selection signal is then provided to the gate of the PMOS 102 and to the inverter 106 through a second node 110. The inverter 106 then provides an inverted select signal to the gate of the NMOS 104 through a third node 114. Also, the drain of the PMOS 102 and the drain of the NMOS 104 are coupled at a fourth node 112.

The transmission gate 100 functions through the use of a selection signal to allow for the transmittal of data. When the select signal is logic high, then data is transmitted. When the select signal is logic low, then the transmission gate 100 enters a high impedance state so that no data is transmitted. However, when active, it is possible for current to flow from the fourth node 112 to the first node 108.

Referring to FIG. 2, the reference numeral 200 generally designates a 3-way mux utilizing transmission gates. The mux 200 comprises a first transmission gate 250, a second transmission gate 252, and a third transmission gate 254.

The first transmission gate 250 comprises a first PMOS 202, a first NMOS 204, and a first inverter 216. The source of the first PMOS 202 is coupled to the source of the first NMOS 204 at first node 228. Data is also input into the first node 228. A first selection signal SELECT1 is then provided to the gate of the first PMOS 202 and to the first inverter 216 through a second node 222. The first inverter 216 then provides an inverted select signal to the gate of the first NMOS 204 through a third node 234. Also, the drain of the first PMOS 202 and the drain of the first NMOS 204 are coupled at a fourth node 240.

The second transmission gate 252 comprises a second PMOS 206, a second NMOS 208, and a second inverter 218. The source of the second PMOS 206 is coupled to the source of the second NMOS 208 at a fifth node 230. Data is also input into the fifth node 230. A second selection signal SELECT2 is then provided to the gate of the second PMOS 206 and to the second inverter 218 through a sixth node 224. The second inverter 218 then provides an inverted select signal to the gate of the second NMOS 204 through a seventh node 236. Also, the drain of the second PMOS 206 and the drain of the second NMOS 208 are coupled at the fourth node 240.

The third transmission gate 254 comprises a third PMOS 210, a third NMOS 212, and a third inverter 220. The source of the third PMOS 210 is coupled to the source of the third NMOS 212 at an eighth node 232. Data is also input into the eighth node 232. A third selection signal SELECT3 is then provided to the gate of the third PMOS 210 and to the third inverter 220 through a ninth node 226. The third inverter 220 then provides an inverted select signal to the gate of the third NMOS 204 through a seventh node 238. Also, the drain of the third PMOS 206 and the drain of the third NMOS 208 are coupled at the fourth node 240.

The mux 200 provides selection signals to specific transmission gate in order to transmit data. However, when active, it is possible for current to travel in reverse through a transmission gate. Therefore, if two transmission gates are "on," then short circuits are possible between the two transmission gates, which can damage the transmission gates and other circuitry providing the data. In an AND-OR topology, however, having two output channels "on" at the same time does not cause any damage because the structure does not permit the currents to change direction through output channels.

Referring to FIG. 3, the reference numeral 300 generally designates a conventional mux utilizing transmission gates. However, signal selection circuitry for a single transmission gate is shown; there is selection circuitry for each of the k transmission gates.

In a typical configuration, the mux 300 comprises k transmission gates 302 and select logic 304. Data is transmitted to the transmission gates 302 through the data lines L1 to Lk. The select logic 304 calculates and transmits k select signals to the k transmission gates 302 through a first communication channel 310. Because the mux 300 does not utilize a latch, it is purely combinational. Hence, the select signal is computed during the same cycle the data is transmitted. Once the select signal has been computed, the k transmission gates 302 can then output a data signal through a second communication channel 308.

When an AND-OR structure or another similar topology is utilized, then having one-hot selection is not necessary. However, with transmission gates and other similar topologies, such as pass gates, one-hot selection is required. In other words, one of the data lines can be selected, and there cannot be a select signal for two or more lines at the same time. If there is not adherence to the one-hot conditions, then there is a substantial risk of a short circuit on the chip. For example, a short between data lines exists where one data line is logic low and one data line is logic high and where there is a selection signal for both data lines. Because the circuits and transistors associated with the data lines are low power and cannot sustain a high current, the circuits on the chip can sustain substantial damage.

For timing purposes, however, in muxes, such as the mux 300, latches can be used. Referring to FIG. 4, the reference numeral 400 generally designates a mux that utilizes a latch. The reasons for utilizing the latch vary; however, typically, latches are used for timing purposes. Also, signal selection circuitry for a single transmission gate can be used; however, selection circuitry is shown, which computes k selection signals for the k transmission gates.

In a typical configuration, the mux 400 comprises k transmission gates 402, select logic 404, and a latch 406. Data is transmitted to the transmission gates 402 through the data lines M1 to Mk. Because the mux 400 utilizes a latch for timing purposes and is not purely combinational, like the mux 300, a cycle before the data is transmitted the select logic 404 calculates and transmits k selection signals to the latch 406 through a first communication channel 410. The latch 406 receives a clock signal and an activation signal through a second communication channel 414 and a third communication channel 416, respectively. Also, the activation signal provided through the third communication channel can be used to preserve power because, when the latch 406 is not active, then power consumption decreases. The latch 406 then communicates a select signal to the k transmission gates 402 through a fourth communication channel 412. The transmission gates 402 can then output a data signal through a fifth communication channel 408.

The mux 400, though, is significantly different from the mux 300 in that the mux 400 has included a latch 406 for timing purposes. The activation signal provided to the latch 406 through the third communication channel 416 allows a select signal to be transmitted to the mux 400. Usually, a logic control mechanism provides the activation signal. For example, if the mux 400 is utilized in a floating point unit, an activation signal is provided when a real floating point instruction exists. Hence, activation would occur when an instruction exists, and the remainder of the time, the latch 406 would be inactive to preserve power and would provide the same select signal as the previous cycle.

When an AND-OR structure or another similar topology is utilized, then having one-hot selection is not necessary. However, with transmission gates and other similar topologies, such as pass gates, one-hot selection is required. In other words, only one of the data lines can be selected, and there cannot be activation signal for two or more lines at the same time. If there is not adherence to the one-hot conditions, then there is a substantial risk of a short circuit on the chip. For example, a short between data lines exists where one data line is logic low and one data line is logic high and where there is a selection signal for both data lines. Because the circuits and transistors associated with the data lines are low power and cannot sustain a high current, the circuits on the chip can sustain substantial damage.

A significant risk, however, is posed because the mux 400 utilizes transmission gates. A difference between the mux 300 and the mux 400 is that the mux 400 would have undefined latch values upon a Power-on Reset (POR). Because of the unknown values of the latch 406, it is conceivable that two data lines may be simultaneously selected to cause a short. With the mux 400, there would not typically be a change in the state of the latch 406 until an activation signal is provided. A substantial amount of time can pass between a POR and an activation signal; thus, damage to the circuit on a chip would be an even more substantial risk due to the length of time of a standing current in a short circuit.

Therefore, there is a need for a method and/or apparatus for protecting transmission gate muxes that addresses at least some of the problems associated with conventional transmission gates.

SUMMARY OF THE INVENTION

The present invention provides a method, an apparatus, and a computer program for protecting transmission gates in a mux. A selection signal is first computed by selection logic, and transmitted to a latch. The latch then can propagate the selection signal to a transmission gate in a mux. However, to propagate the selection signal, there is an transmittal signal that enables transmission. The transmittal signal is provided by logically combining an activation signal and a POR signal.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

Figure 1:
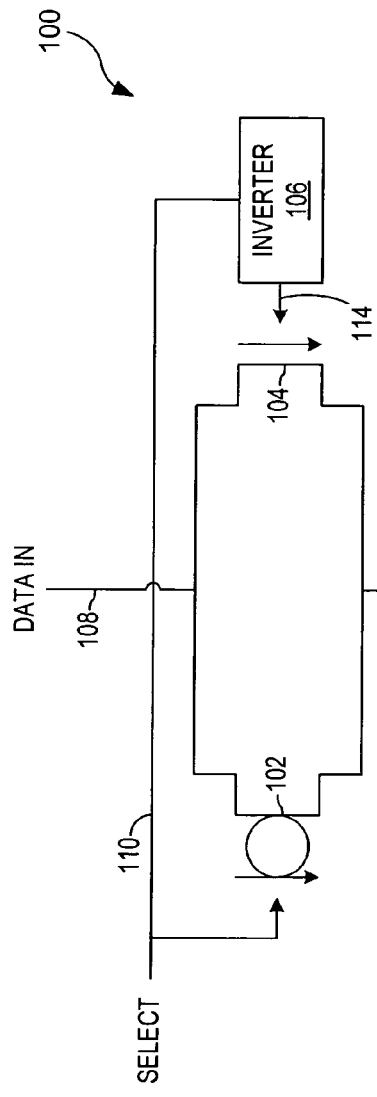
FIG. 1 is a block diagram depicting a conventional transmission gate.
Figure 2:
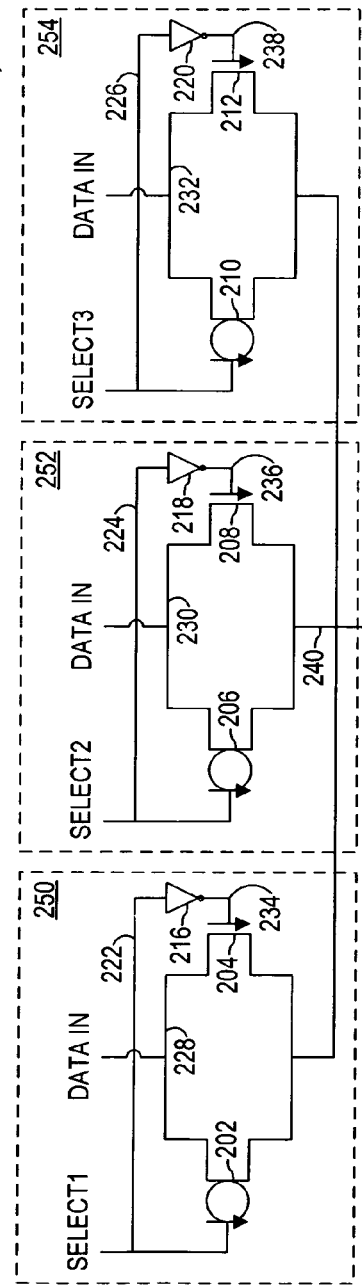
FIG. 2 is a block diagram depicting a conventional 3-way mux utilizing transmission gates.
Figure 3:
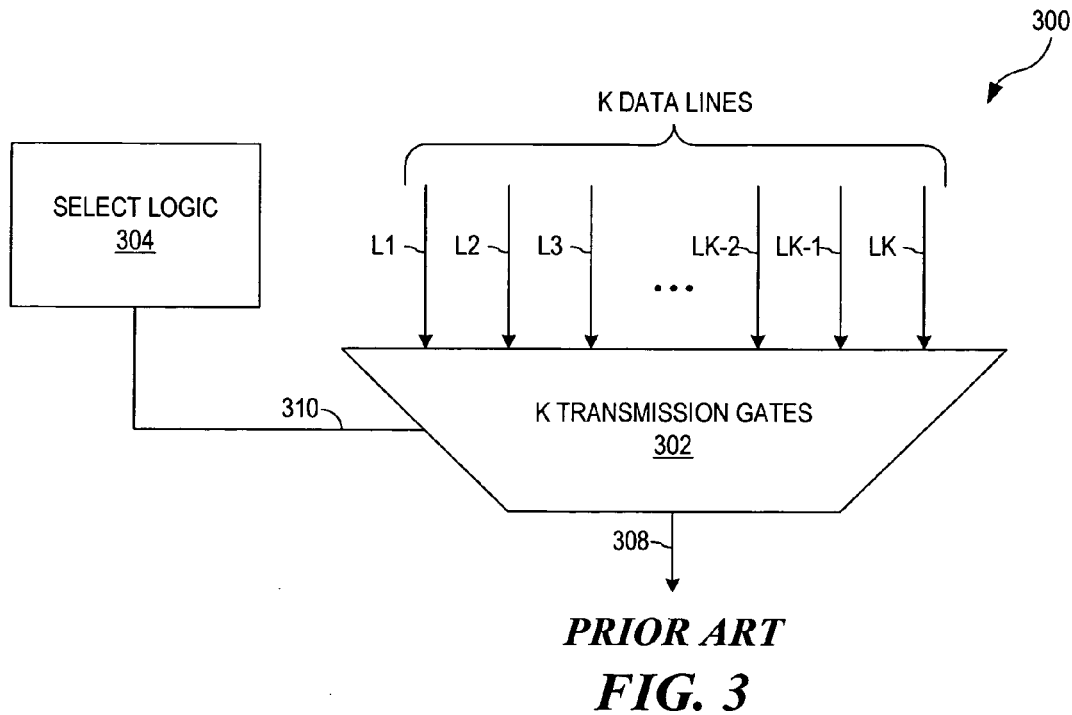
FIG. 3 is a block diagram depicting a conventional mux utilizing transmission gates.
Figure 4:
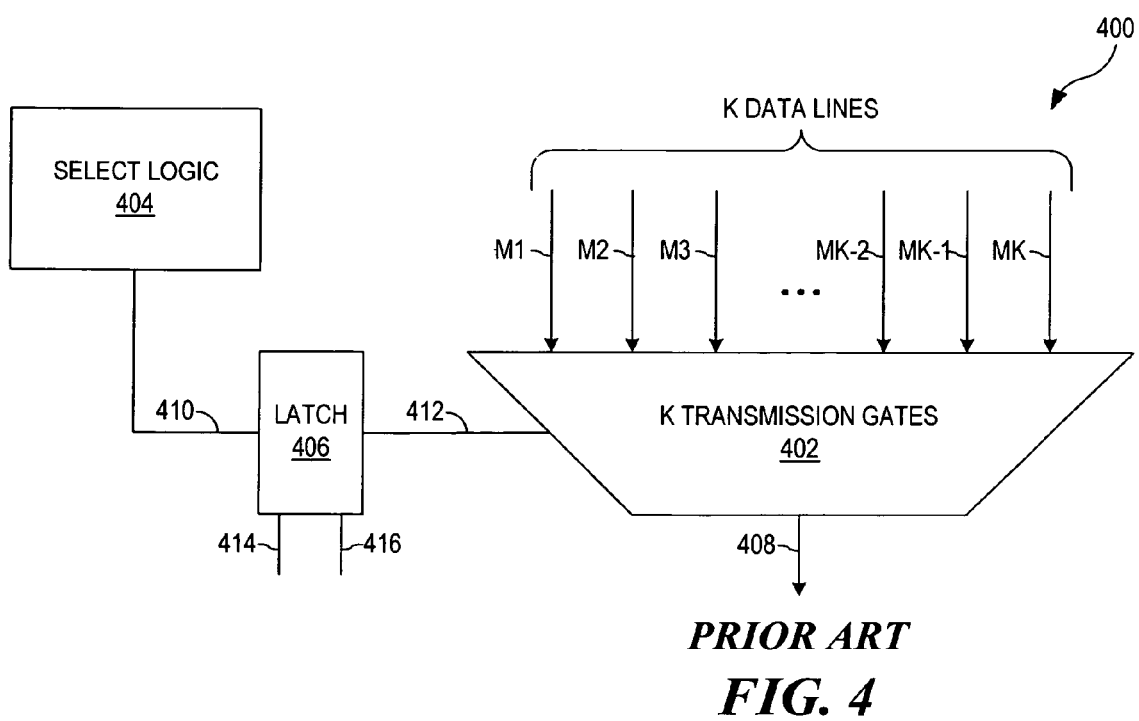
FIG. 4 is a block diagram depicting a conventional mux utilizing transmission gates that also utilizes a latch.
Figure 5:
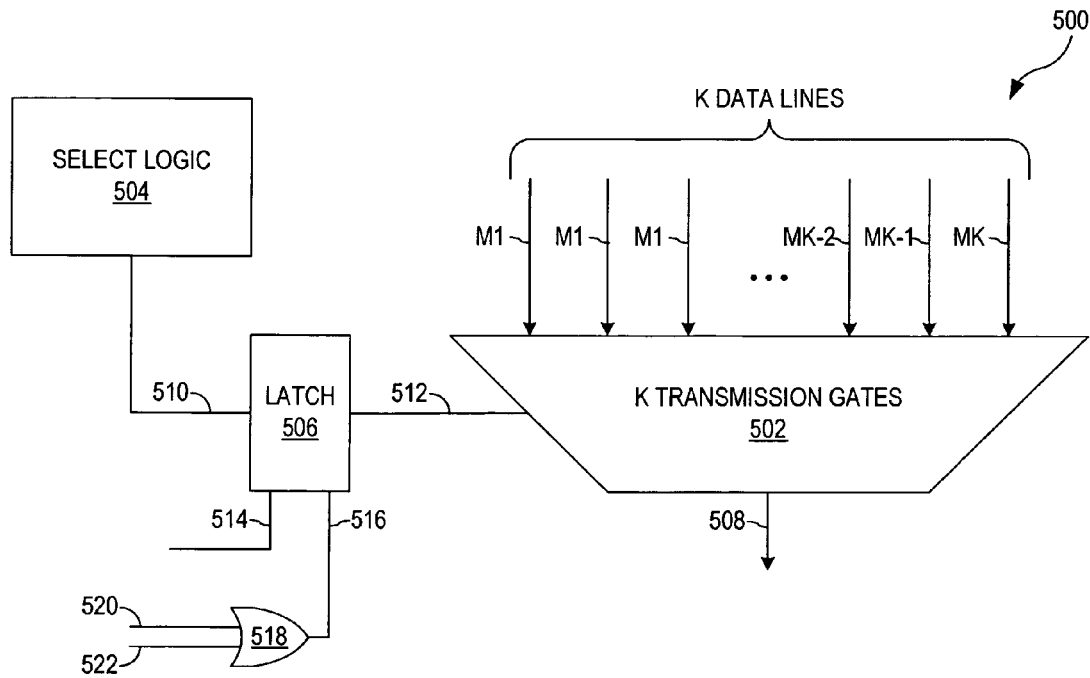
FIG. 5 is a block diagram depicting a mux that utilizes a reset triggered latch.

Referring to FIG. 5, the reference numeral 500 generally designates a mux that utilizes a reset triggered latch. The reasons for utilizing the latch vary; however, typically, latches are used for timing purposes. Also, signal selection circuitry for a single transmission gate can be used; however, selection circuitry is shown, which computes k selection signals for the k transmission gates. Moreover, other topologies, such as pass-gates, can be utilized, which also require one-hot selections.

In a typical configuration, the mux 500 comprises k transmission gates 502, select logic 504, a latch 506, and an OR gate 518. Data is transmitted to the transmission gates 502 through the data lines M1 to Mk. However, a cycle before the data is transmitted, the select logic 504 calculates and transmits k selection signals to the latch 506 through a first communication channel 510. Also, the select logic 504 can be configured to transmit k select signals to the k transmission gates 502 through the first communication channel 510. The latch receives a clock signal and an enable signal through a second communication channel 514 and a third communication channel 516, respectively. The enable signal is the product of ORing an activation signal and an POR signal, which are provided to the OR gate 518 through fourth communication channel 520 and a fifth communication channel 522, respectively. The latch 506 then communicates a select signal to the transmission gates 502 through a sixth communication channel 512. The transmission gates 502 can then output a data signal through a seventh communication channel 508.

The mux 500, then, can force a propagation or a denial of propagation of the precomputed select signals during Power-on Reset. During a Power-on Reset, the system provides a POR signal from chip components that control chip initialization. When the POR signal becomes high, the OR gate 518 outputs a logic high signal to activate the latch 506. It is assumed that the select logic is correct in producing one-hot selects. Therefore, after the first clock edge, the forced update of the latch 506 will result in a one-hot output because the select logic 504 produces one-hot selects. Thereafter, any other updates of the latch 506 would result in one-hot outputs. Hence, the risk of non-adherence to one-hot condition for the mux 500 would effectively be eliminated after the first clock edge.

The time between activation of the latch 506 and the first clock edge is a short period of time. Typically, the time between activation and the first clock edge is on the order of a few microseconds and, possibly, as long as a millisecond. During this period, the possibility of having signals that do not adhere to the one-hot condition for the mux 500 exists. In a number of microprocessors, for the few microseconds or a millisecond, any shorts would not generally be long enough to cause damage to circuitry.

Figure 6:
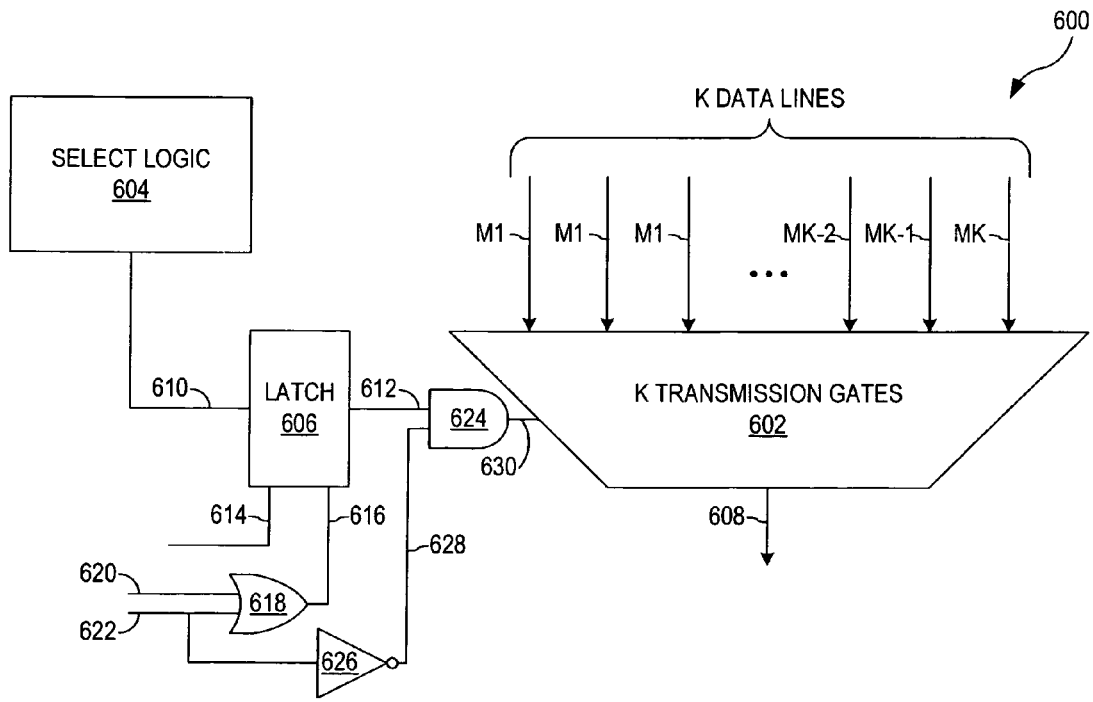
FIG. 6 is a block diagram depicting a mux that utilizes a rapid reset response.

However, for some microprocessors, a short for a few microseconds or a millisecond would damage circuitry. Referring to FIG. 6 of the drawings, the reference numeral 600 generally refers to a mux that utilizes a rapid reset response. The mux 600 is specifically designed to have a more rapid response time to assist in alleviating any potential damage that could be done to microprocessor circuitry as a result of short circuits. Also, signal selection circuitry for a single transmission gate can be used; however, selection circuitry is shown, which computes k selection signals for the k transmission gates. Moreover, other topologies, such as pass-gates, can be utilized, which also require one-hot selections.

In a typical configuration, the mux 600 comprises k transmission gates 602, select logic 604, a latch 606, an OR gate 618, an AND gate 624, and an inverter 626. Data is transmitted to the transmission gates 602 through the data lines M1 to Mk. However, a cycle before the data is transmitted, the select logic 604 calculates and transmits k selection signals to the latch 606 through a first communication channel 610. Also, the select logic 604 can be configured to transmit k select signals to the k transmission gates 602 through the first communication channel 610. The latch receives a clock signal and an enable signal through a second communication channel 614 and a third communication channel 616, respectively. The enable signal is the product of ORing an activation signal and an POR signal, which are provided to the OR gate 618 through fourth communication channel 620 and a fifth communication channel 622, respectively. Also, the POR signal is transmitted through the fifth communication channel 622 to the inverter 626. An inverted POR signal is then communicated to the AND gate 624 through a sixth communication channel 628. Also, the latch 606 transmits a select signal to the AND gate 624 through a seventh communication channel 612. The AND gate then can output a forced select signal to the mux 602 through an eighth communication channel 630. The mux 602 can then output a data signal through a ninth communication channel 608.

The mux 600, then, can force a propagation or a denial of propagation of the precomputed select signals during Power-on Reset. During a Power-on Reset, the system provides a POR signal from chip components that control chip initialization. When the POR signal becomes high, the OR gate 618 outputs a logic high signal to activate the latch 606. It is assumed that the select logic is correct in producing one-hot selects. Therefore, after the first clock edge, the forced update of the latch 606 will result in a one-hot output. Thereafter, any other updates of the latch 606 would result in one-hot outputs. Hence, the risk of non-adherence to one-hot condition for the mux 602 would effectively be eliminated after the first clock edge.

Additionally, there is a reduced danger of a short circuit during the time between an activation or a Power-on Reset of the latch 606 and the first clock edge. When the POR signal becomes logic high, the output of the AND gate 624 becomes logic low. Therefore, regardless of the output of the latch, the forced select signal is logic low, which prevents any errant selection signals that may cause a short circuit. Then, at some point in time, the first clock edge will occur. Once, the clock edge occurs, the output signal from the latch 606 is one-hot, even when the POR signal eventually goes down. Hence, the k transmission gates 602 are protected. However, if there is an activation signal, when there is no POR signal, the AND gate 624 allows for the proper select signal to be transmitted to the k transmission gates 602.

Figure 7:
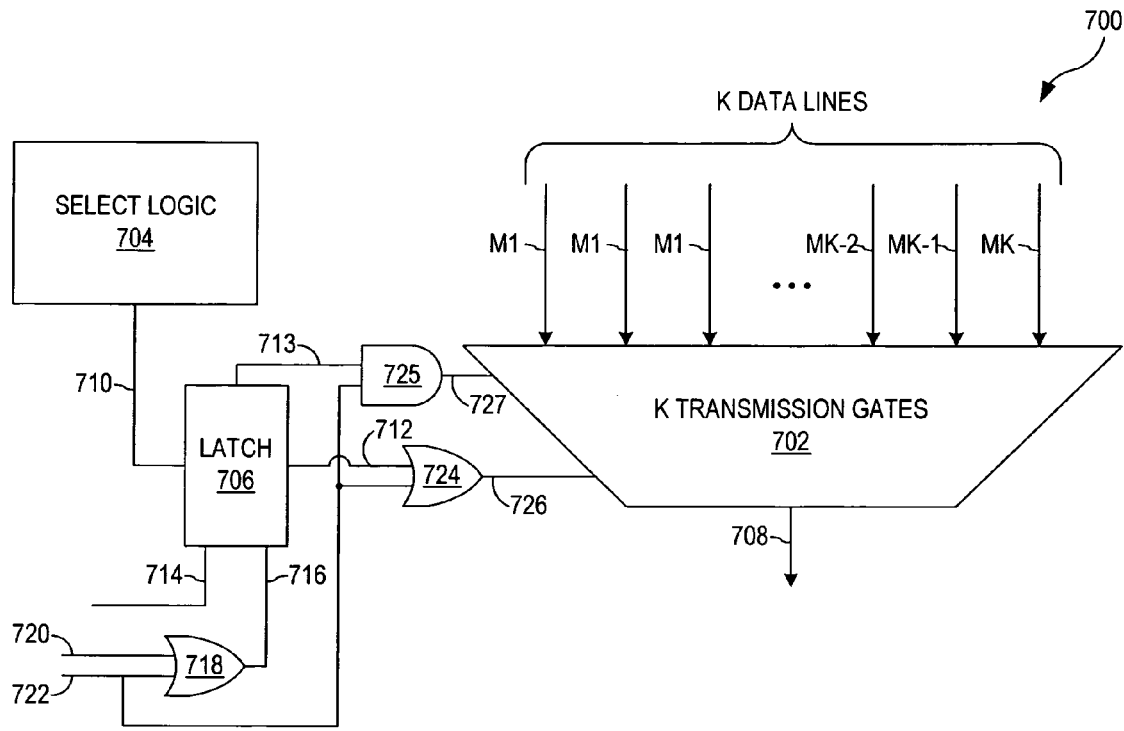
FIG. 7 is a block diagram depicting a mux that utilizes a rapid reset response with a second configuration.

During Power-on Reset with the mux 600, none of the select lines are active, resulting in a high impedance output of the mux 600. For some circuitry, a high impedance output may not be tolerable. Therefore, there are other configurations to prevent short circuits during a short period of time between a POR signal and a clock edge. Referring to FIG. 7 of the drawings, the reference numeral 700 generally refers to a mux that utilizes a rapid reset response with a second configuration. The mux 700 is specifically designed to have a more rapid response time to assist in alleviating potential damage that could be done to microprocessor circuitry as a result of short circuits. Some microprocessor circuitry may also not be able to tolerate a high impedance state, requiring one select signal. Also, signal selection circuitry for a single transmission gate can be used; however, selection circuitry is shown, which computes k selection signals for the k transmission gates. Moreover, other topologies, such as pass-gates, can be utilized, which also require one-hot selections.

In a typical configuration, the mux 700 comprises k transmission gates 702, select logic 704, a latch 706, a first OR gate 718, a second OR gate 724, and an AND gate 725. Data is transmitted to the mux 702 through the data lines M1 to Mk. However, a cycle before the data is transmitted, the select logic 704 calculates and transmits k selection signals to the latch 706 through a first communication channel 710. Also, the select logic 704 can be configured to transmit k select signals to the k transmission gates 702 through the first communication channel 710. The latch 706 receives a clock signal and an enable signal through a second communication channel 714 and a third communication channel 716, respectively. The enable signal is the product of ORing an activation signal and an POR signal, which are provided to the first OR gate 718 through fourth communication channel 720 and a fifth communication channel 722, respectively. Also, the POR signal is transmitted through the fifth communication channel 722 to the second OR gate 724 and the AND gate 725. Also, the latch 706 transmits select signals to the second OR gate 724 and the AND gate 725 through a sixth communication channel 712 and a seventh communication channel 713, respectively. The second OR 724 gate then can output a forced select signal to the transmission gates 702 through an eighth communication channel 726, while the AND gate 713 outputs a select signal through ninth communication channel 727 only when POR signal is logic high. The transmission gates 702 can then output a data signal through a tenth communication channel 708. The second OR gate 724, though, is used for one select line while AND gates, such as the AND gate 725, are used for the remainder of the select lines. Therefore, it is insured that exactly one signal is selected during Power-on Reset.

The mux 700, then, can force a value to the select signals during Power-on Reset. During a Power-on Reset, the system provides a POR signal from chip components that control chip initialization. When the POR signal becomes high, the first OR gate 718 outputs a logic high signal to active the latch 706. It is assumed that the select logic is correct in producing one-hot selects. Therefore, after the first clock edge, the forced update of the latch 706 will result in a one-hot output. Thereafter, any other updates of the latch 706 would result in one-hot outputs. Hence, the risk of non-adherence to one-hot condition for the mux 700 would effectively be eliminated after the first clock edge.

Additionally, there is a reduced danger of a short circuit during the time between activation of the latch 706 and the first clock edge because of the short period of time. When the POR signal becomes logic high, the output of the second OR gate 724 becomes logic high. Therefore, regardless of the output of the latch, the forced select signal is logic high, which insures that one signal is selected compared to the mux 600 where no signal is selected. However, if there is an activation signal, when there is no POR signal, the second OR gate allows for the proper select signal to be transmitted to the transmission gates 702. However, to produce this result, one transmission gate can utilize the OR gate 724, whereas the remaining k-1 transmission gates employ AND gates. Therefore, there is both a rapid reaction to a Power-On Reset, and a high impedance condition is effectively eliminated.

Figure 8:
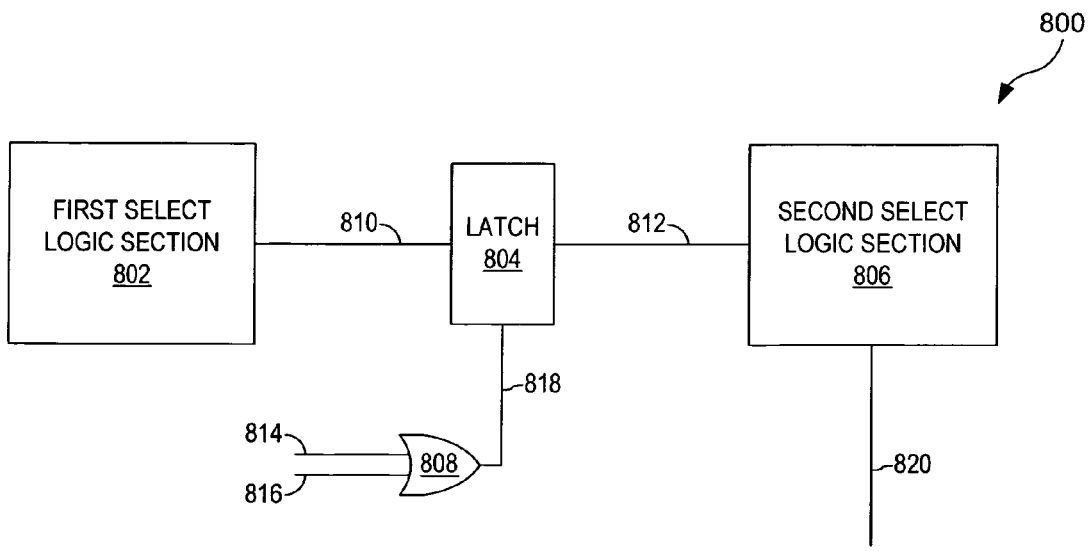
FIG. 8 is a block diagram depicting sectioned selection logic that utilizes a reset triggered latch.

Instead of performing the complete selection signal computation in one logic cycle and latching the final select signals, the select logic can be subdivided into two sections. Referring to FIG. 8 of the drawings, the reference numeral 800 generally refers to a selection logic that utilizes a latch to insure a one-hot select signal.

In a typical configuration, the selection logic 800 comprises a first selection logic section 802, a latch 804, a second select logic section 806, and an OR gate 808. The division of the selection logic 800 into two sections is generally related to timing. The first section 802 performs some of the computations related to selection. However, the output of the first section 802 may not be one-hot. Therefore, the output of the first section 802 is transmitted to the latch 804 through a first communication channel 810. The latch 804 can then insure that the output of the first section 802 is transmitted to second section through a second communication channel 812. A one-hot signal is then insured as a result of the combination of the first section 802 and the second section 806. The second section 806 can then transmit a selection signal through the third communication channel 820.

However, in order for the selection logic 800 to output a one-hot select signal, the latch 804 must be active. Activation is provided by the output of the OR gate 808 through a fourth communication channel 818. The OR gate derives the latch activation or deactivation through the reception of an activation signal and of a POR signal through a fifth communication channel 814 and a sixth communication channel 816, respectively. Therefore, by interposing the latch 804 between the first section 802 and the second section 806 in the select logic 800, one-hot selection signals can be insured.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for protecting a plurality of gate circuits, comprising:
   a multiplexer (mux) having the plurality of gate circuits;
   a plurality of latches, wherein each of the latches is at least configured to output an indicia of a select signal to at least one gate circuit of the plurality of gate circuits; and
   a plurality of first logic gates, wherein each of the first logic gates of the plurality of first logic gates is at least configured to provide an activation signal from a Power-On Reset (POR) signal to at least one latch of the plurality of latches.

2. The apparatus of claim 1, wherein the plurality of gate circuits are selected from the group consisting of transmission gates and pass-gates.

3. The apparatus of claim 1, wherein the plurality of first logic gates further comprises a plurality of OR gates.

4. The apparatus of claim 1, wherein the apparatus further comprises a plurality of second logic gates, wherein each second logic gate of the plurality of second logic gates is at least configured to receive an output of at least one latch and to receive indicia of a POR, and wherein each second logic gate is at least configured to output a select signal to at least one gate circuit of the plurality of gate circuits.

5. The apparatus of claim 4, wherein the plurality of second logic gates further comprises at least one OR gate.

6. The apparatus of claim 4, wherein the plurality of second logic gates further comprises a plurality of AND gates.

7. A method for protecting gate circuits in a mux, comprising:
   computing a selection signal;
   transmitting the selection signals to at least one latch of a plurality of latches;
   logically combining at least one activation signal of a plurality of activation signals and at least one POR signal of a plurality of POR signals to produce a first logic output for the at least one latch of the plurality of latches; and
   enabling the at least one latch of the plurality of latches to transmit the selection signal based on the first logic output.

8. The method of claim 7, wherein the step of logically combining further comprises ORing the at least one activation signal and the at least one POR signal.

9. The method of claim 7, wherein the method further comprises:
   inverting the at least one POR signal to produce an inverted POR signal;

communicating the inverted POR signal to at least one second logic gate of a plurality of second logic gates;

receiving a transmitted selection signal the at least one second logic gate of the plurality of second logic gates;

logically combining the inverted POR signal and the transmitted selection signal to provide a logically combined signal; and receiving the logically combined signal at a transmission gate of a plurality of transmission gates.

10. The method of claim 9, wherein the step of logically combining the inverted POR signal and the transmitted selection signal further comprises ANDing the inverted POR signal and the transmitted selection signal.

11. The method of claim 9, wherein the step of logically combining the inverted POR signal and the transmitted selection signal further comprises ORing the inverted POR signal and the transmitted selection signal.

12. A computer program product for protecting gate circuits in a mux, the computer program product having a computer readable medium with a computer program embodied thereon, the computer program comprising:

computer code for computing a selection signal;

computer code for transmitting the selection signals to at least one latch of a plurality of latches;

computer code for logically combining at least one activation signal of a plurality of activation signals and at least one POR signal of a plurality of POR signals to produce a first logic output for the at least one latch of the plurality of latches; and computer code for enabling the at least one latch of the plurality of latches to transmit the selection signal based on the first logic output.

13. The computer program product of claim 12, wherein the computer code for logically combining further comprises computer code for ORing the at least one activation signal and the at least one POR signal.

14. The computer program product of claim 12, wherein the computer program further comprises:

computer code for inverting the at least one POR signal to produce an inverted POR signal;

computer code for communicating the inverted POR signal to at least one second logic gate of a plurality of second logic gates;

computer code for receiving a transmitted selection signal the at least one second logic gate of the plurality of second logic gates;

computer code for logically combining the inverted POR signal and the transmitted selection signal to provide a logically combined signal; and computer code for receiving the logically combined signal at a transmission gate of a plurality of transmission gates.

15. The computer program product of claim 14, wherein the computer code for logically combining the inverted POR signal and the transmitted selection signal further comprises computer code for ANDing the inverted POR signal and the transmitted selection signal.

16. The computer program product of claim 14, wherein the computer code for logically combining the inverted POR signal and the transmitted selection signal further comprises computer code for ORing the inverted POR signal and the transmitted selection signal.

17. A processor for protecting gate circuits in a mux, the processor including a computer program comprising:

computer code for computing a selection signal;

computer code for transmitting the selection signals to at least one latch of a plurality of latches;

computer code for logically combining at least one activation signal of a plurality of activation signals and at least one POR signal of a plurality of POR signals to produce a first logic output for the at least one latch of the plurality of latches; and computer code for enabling the at least one latch of the plurality of latches to transmit the selection signal based on the first logic output.

18. The computer program of claim 17, wherein the computer code for logically combining further comprises computer code for ORing the at least one activation signal and the at least one POR signal.

19. The computer program of claim 17, wherein the computer program further comprises:

computer code for inverting the at least one POR signal to produce an inverted POR signal;

computer code for communicating the inverted POR signal to at least one second logic gate of a plurality of second logic gates;

computer code for receiving a transmitted selection signal the at least one second logic gate of the plurality of second logic gates;

computer code for logically combining the inverted POR signal and the transmitted selection signal to provide a logically combined signal; and computer code for receiving the logically combined signal at a transmission gate of a plurality of transmission gates.

20. The computer program of claim 19, wherein the computer code for logically combining the inverted POR signal and the transmitted selection signal further comprises computer code for ANDing the inverted POR signal and the transmitted selection signal.

21. The computer program of claim 19, wherein the computer code for logically combining the inverted POR signal and the transmitted selection signal further comprises computer code for ORing the inverted POR signal and the transmitted selection signal.

* * * * *